United States Patent
Hull et al.

[19]

[11] Patent Number: 5,812,456
[45] Date of Patent: Sep. 22, 1998

[54] SWITCHED GROUND READ FOR EPROM MEMORY ARRAY

[75] Inventors: Richard Hull, Chandler; Randy L. Yach, Phoenix, both of Ariz.

[73] Assignee: Microchip Technology Incorporated, Chandler, Ariz.

[21] Appl. No.: 723,927

[22] Filed: Oct. 1, 1996

[51] Int. Cl.⁶ .................................................. G11C 7/02
[52] U.S. Cl. .......................... 365/185.16; 365/185.25; 365/185.23; 365/185.24; 365/185.21; 365/185.17
[58] Field of Search .................. 365/185.01, 185.16, 365/205, 230.01, 185.25, 185.23, 185.24, 185.21, 185.17

[56] References Cited

U.S. PATENT DOCUMENTS 4,713,797 12/1987 Morton et al. .......................... 365/208
5,487,037 1/1996 Lee ...................................... 365/187.11

*Primary Examiner*—Viet Q. Nguyen
*Attorney, Agent, or Firm*—Blank Rome Comisky & McCauley LLP

[57] ABSTRACT

A technique for reading data from a selected memory element of an EPROM array having rows and columns with addressable memory elements which may be selectively accessed at respective intersections of the rows and columns. Each memory element includes a transistor having gate, source and drain electrodes, and after selection of a particular memory element from which data is to be read by appropriately biasing the row and column associated with that memory element, the source electrode thereof is selectively connected to ground by a switching element to allow current flow through the source-drain path of the memory element and enable the readout of data therefrom after the drain and gate voltages of the memory element have stabilized.

14 Claims, 2 Drawing Sheets

SWITCHED GROUND READ FOR EPROM MEMORY ARRAY

CROSS-REFERENCE TO RELATED APPLICATIONS

This application is related to co-pending applications titled "Voltage Reference Generator for EPROM Memory Array" Ser. No. 08/723,924, "High Voltage Level Shifting CMOS Buffer" Ser. No. 08/723,925, and "Overcharge/Discharge Voltage Regulator for EPROM Memory Array" Ser. No. 08/723,926, filed on the same day and assigned to the same assignee as this application, and the disclosures of which are incorporated herein by reference.

BACKGROUND OF THE INVENTION

The present invention relates generally to read-only memory devices and memory arrays, and to improved techniques and devices for reading data from such devices and arrays, and more particularly to improved structures and methods for reading data from erasable programmable read-only memory (EPROM) devices.

EPROM devices are fabricated using semiconductor process technology. As line widths are reduced in progression of the process technology it may be desirable not only to design and fabricate entirely new versions of products but to "shrink" or scale existing products to a smaller size with the new technology. This requires review and analysis of the design and architecture of the product and the manner in which the attempted scaling of its size may adversely affect its operation. The present invention arose from the task to shrink EPROM products according to a new process technology, in a cost-effective and operation-feasible manner.

In undertaking such a task for an EPROM program memory embedded in a microcontroller, for example, the scaling process imposes restrictions which, when coupled with the device requirements, makes the task extremely difficult. Some of the issues encountered in implementing a scaling process for such a device are wide voltage range, low program read margins, high speed, and low current. In particular, the read margins of the scaled EPROM are typically lower than the operating voltage range of the device.

In a classic implementation of an EPROM array embedded in a microcontroller, the supply voltage of the microcontroller is used to control the EPROM memory element so as to enable reading of the data stored in the element. To read the data, a measurement of the programmed threshold voltage of the memory element is required. The memory element is said to be erased if the threshold voltage of the EPROM cell is low, and to be programmed if the threshold voltage is high. The cell is read by applying a voltage to the control gate of a transistor comprising the cell. If the applied voltage is higher than the threshold, current flows through the cell. The programming margin of the cell is the voltage difference between the maximum applied control gate voltage and the programmed threshold voltage of the programmed cell. A programmed EPROM cell will not conduct current when read by application of a control gate voltage of lower magnitude than the high threshold voltage of the cell.

In most implementations, the control gate voltage used to read the memory array is the supply voltage of the system. If the programmed threshold of the memory cell is lower than the maximum value of that supply voltage, a programmed cell cannot be detected using the classic techniques.

Scaling the device to smaller size also has the effect of reducing the voltage range which is used to operate the EPROM. When an EPROM memory cell is shrunk, the programmed threshold voltage is decreased and the effective programming margin is lowered. Also, a smaller EPROM cell typically dictates a lower read current. All of this makes it difficult to read the data in a scaled EPROM cell by means of standard techniques.

Lowering the read margin voltage below the supply voltage requires that the row control voltage (i.e., the voltage that controls the gate of the EPROM memory element) be regulated to a lower value. If the control gate voltage is not reduced to a level below the magnitude of the programmed threshold voltage, the contents of the EPROM memory cell cannot be read. Regulating the row control voltage usually requires the consumption of significant amounts of current, especially if the electrical node being driven requires high speed operation or is heavily loaded with capacitance.

A typical solution to regulate the row control voltage would be to clamp the row voltage by bleeding off current proportional to the supply voltage to limit the final voltage that is applied to the EPROM element. In the classic EPROM read architecture, the row drive circuitry is also required to be high speed and has a significant amount of capacitive loading. This makes the job of regulating the final voltage very difficult when given the constraints of low current consumption and high speed operation.

In the prior art, the EPROM architecture has used a high voltage supply applied directly to the sense amplifier and the X-decoder of the EPROM array. Either the X-decoder, which translates into a row in the array, or the sense amplifier, which translates into a column in the array, is driven, which brings both devices to high voltage. A transistor is present at the intersection of a row with a column, and current flows through the memory cell that comprises the transistor, to program it. As an EPROM program memory device undergoes a shrink, the maximum voltage that can be put on the part is reduced from that used with the previous device size. However, the device requires a certain magnitude of voltage for programming, which is determined by a program voltage requirement that does not shrink together with the technology.

With $V_{DD}$ on the row, the program threshold of the product is typically exceeded with the new technology, which presents a challenge in seeking to read the array at the same speed as in the pre-shrink implementation and without a penalty of excessive current. In a prior art suggested solution, the X-decoder of the array is used as part of the speed path. When that device is turned on, some time elapses for propagation through the decoder. The selected column is then turned on, and is read through the sense amplifier. The period of delay for read access by this method is the result of proceeding through the X-decoder, the word, the column, and into the sense amplifier to output the data from the cell. This operation imposes a significant time delay in reading the array, and thus limits the speed of the device.

In a classic EPROM architecture, the EPROM is made ready to be read by initializing the sense amplifier. Then, the row is turned on which propagates the enable voltage to the memory element. The memory cell is then turned on and the bit is read. This method involves making the row decoder (X decoder) drive very fast. When scaling the memory element and adding the voltage regulator necessary to achieve an adequate programming margin, the resultant time required to read the memory element while consuming low current is very long.

It is a principal aim of the present invention to provide improvements in reading the array at high speed, without the penalty of excessive dissipation of current.

SUMMARY OF THE INVENTION

According to the invention, an improved technique is used which allows the array to be read at a speed comparable to an EPROM of the pre-shrink design, and without a penalty of excess current consumption. In particular, the ground side or ground plane of the entire memory array is switched on or off (connected or disconnected to the read circuit) through a switch (e.g., a transistor), when the selected memory element or cell (itself a transistor with a normally floating source-drain path) is to be read or released. The X-decoder is turned on initially concurrently with everything else except the ground connection. When the cell is to be read, the array is simply grounded through the switch, and the cell data is read by the relatively low current flow detected by the sense amplifier.

The X-decoder is fed by a voltage source (i.e., regulator or reference), and when the X-decoder is being read, this source clamps the voltage on the word at a relatively low value, with virtually no current dissipation. The voltage never exceeds the program threshold, and substantially the same voltage source used to limit the row control voltage to the X-decoder is also applied to the Y-decoder and limits the column control voltage to ensure operation at the right point. Everything is pre-charged—and is turned on—except for ground. All of the voltages are allowed to come up to full scale. Then, when it is time to read the memory cell, ground is switched on and the data is read out.

Accordingly, a more specific object of the present invention is to provide an improved technique for reading a memory element of an EPROM array, in which a read instruction is performed after everything in the circuit is set up, to switch on a ground connection to the source-drain path of a transistor comprising the memory element so that current will flow through that path, for detection by a sense amplifier in the column circuit.

BRIEF DESCRIPTION OF THE DRAWINGS

The above and still further aims, objects, features, aspects, and attendant advantages of the invention will become apparent from a consideration of the best mode presently contemplated for practicing the invention, as implemented in a preferred embodiment and method, taken in conjunction with the accompanying drawings, in which.

DETAILED DESCRIPTION OF THE PREFERRED EMBODIMENT AND METHOD

Figure 1:
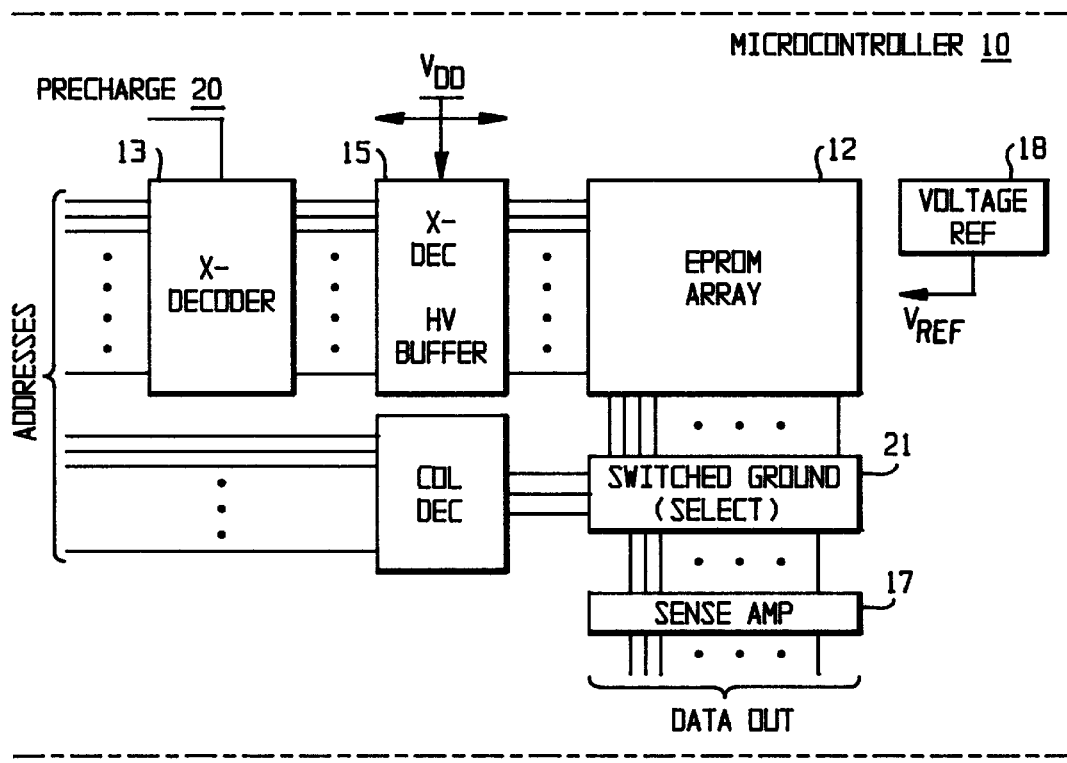
FIG. 1 is a circuit diagram of an exemplary EPROM array circuit embedded in a microcontroller device, in which the present invention is used.

An example of an applicable portion of an EPROM device embedded in a microcontroller in which the present invention is embodied is illustrated in the circuit diagram of FIG. 1. Portions of the circuit of particular interest include an X-decoder 13, X-decoder high voltage level shifting complementary metal-oxide-silicon (CMOS) buffer 15, voltage reference 18, row pre-charge 20, row clamp, sense amplifier 17, and switched ground or read control circuit 21, all associated with the EPROM device.

An EPROM array 12 is embedded as a program memory in a microcontroller 10. The memory array is composed of the usual rows and columns in which the state of a transistor (i.e., presence or absence of a device) at the intersection of any given row and column represents the value ("0" or "1") of the bit stored at that array location. The standard supply voltage $V_{DD}$ of the microcontroller is used to control the EPROM memory element so as to read the data stored in the memory element. X-decoder 13, which is essentially the row driver circuit for EPROM array 12, generates the control gate voltage and the control programming voltage for the array in the low voltage mode of operation. X-decoder high voltage level shifting CMOS buffer 15 is coupled to the supply voltage $V_{DD}$ to translate that voltage to a high voltage to program the EPROM memory element in the high voltage mode of operation, and is also used in conjunction with sense amplifier 17 for the array.

Voltage reference 18 is employed to limit the read voltage of the control gate and the drain of the EPROM memory element. A row precharge circuit is typically used with an EPROM to improve the time in which array locations are accessed to read data, or to reduce DC power dissipation, or both. Here, the row precharge 20 is done in the regulator circuit and is passed on to X-decoder 13 to drive the control gate. Sense amplifier 17 senses the current in the memory element, and determines the threshold of the EPROM element.

Read control or switched ground circuit 21 is used according to the invention to significantly reduce the access time of the EPROM array. The circuit is premised on current flow in the memory element only if the control gate of the element is high, the drain of the element is connected to the sense amplifier, and the source of the element is connected to ground. During the setup of the row control voltage, the source is disconnected from ground until the voltage has reached a predetermined appropriate level. At that point, the source is grounded and current flows through the memory element.

Figure 2:
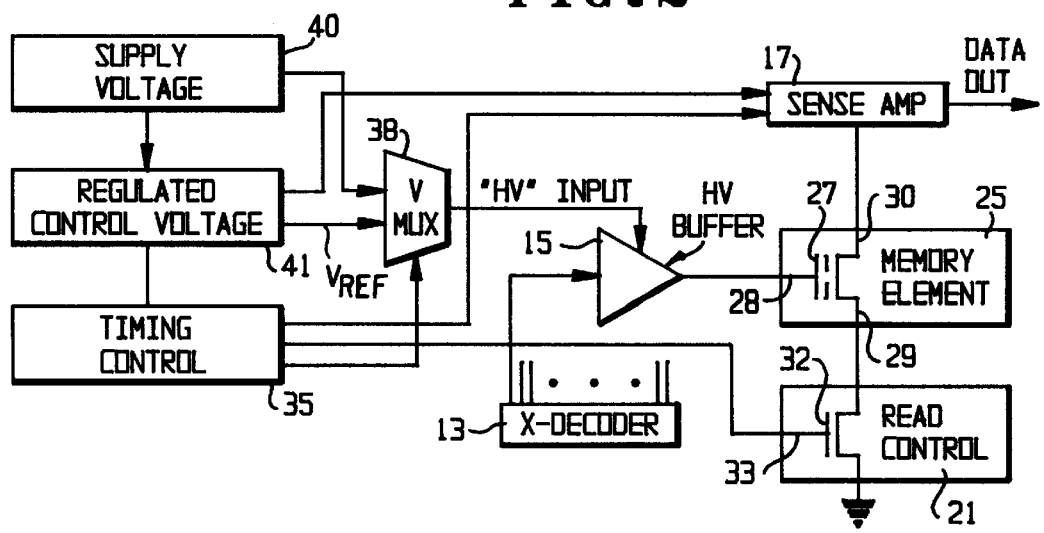
FIG. 2 is a circuit diagram including a preferred embodiment for applying a switched ground read instruction to a memory element of the EPROM array of FIG. 1 according to the invention.

In the circuit diagram of FIG. 2, memory element 25 of the array 12 comprises an MOS transistor 27 having a control gate 28, a source electrode 29, and a drain electrode 30. The drain electrode is connected to sense amplifier 17 which provides the data output from a read of the memory element 25. Initially, the control gate 33 of a switching transistor 32 in the read control constituting switched ground circuit 21 has a control gate voltage applied during a first clock period from a timing control circuit 35 to which gate 33 is coupled. The level of the control gate voltage is predetermined to keep transistor 32 normally switched off, so as to disconnect source electrode 29 of transistor 27 from ground. In other words, the source-drain path of transistor 32 is normally floating.

During the first clock period, the timing control 35 delivers a signal to a voltage multiplexer (VMUX) 38, which receives dual inputs from the standard supply voltage 40 (i.e., $V_{DD}$) and a regulated control voltage 41, to provide a voltage level to the control gate 28 of memory element 25 via a buffer. In particular, the output of VMUX 38 is coupled as a high voltage input to buffer 15, and the output of the buffer is applied to control gate 28. As a consequence, the memory element is quickly pre-charged to a level substantially equal to the supply voltage, which may be above the programmed threshold of the memory element. Timing control 35 then delivers a switching signal to VMUX 38 to remove the supply voltage from the control gate of memory element 25 and replace it with the lower regulated control voltage 41, so that the row control voltage of the memory element is discharged to a value lower than the EPROM programmed threshold voltage.

According to the invention, the timing control then switches on transistor 32 of switched ground circuit 21 by application of an appropriate voltage to its control gate 33 during the very next clock period. As a result, the source electrode 29 of transistor 27 is now connected to ground so that current may flow through the source-drain path of memory element 25, which enables the element to be read, after the gate and drain electrode voltages have stabilized. To that end, the timing control also activates sense amplifier 17 to detect the current flow and provide a data readout.

Figure 3:
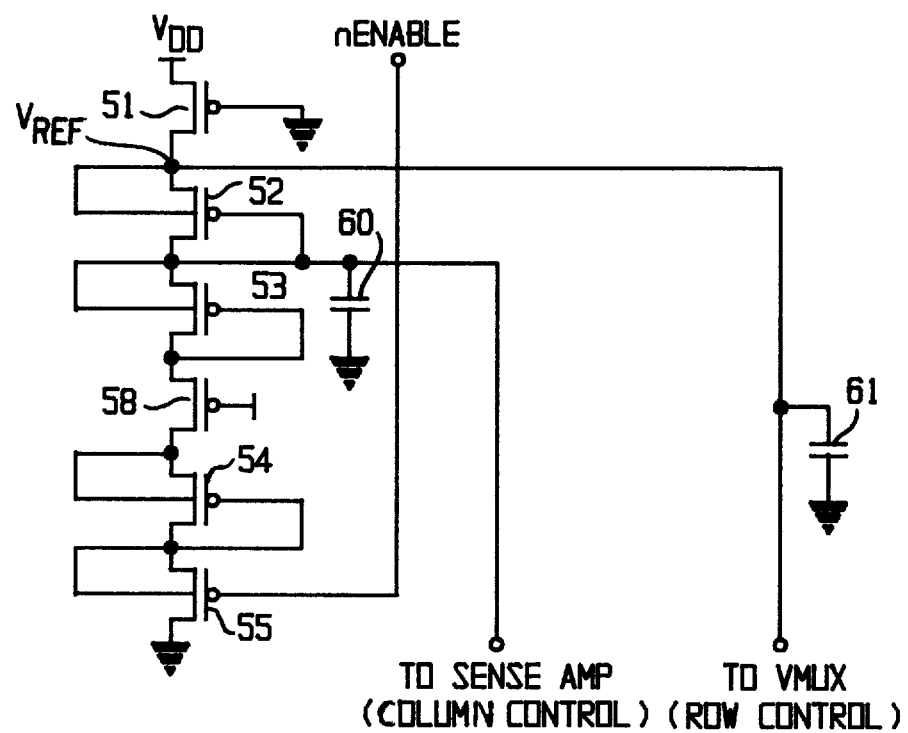
FIG. 3 is an exemplary embodiment of a regulated voltage reference generator employed in the EPROM circuit of FIG. 2.

FIG. 3 illustrates an exemplary embodiment of the regulated control voltage circuit 41 of FIG. 2, including a plurality of PMOS transistors 51, 52, 53, 54, and 55, and an NMOS transistor 58. Transistor 51 is selected to have a current carrying capability significantly lower than that of the other transistors, so that as $V_{DD}$ rises, the voltage at the drain electrode of transistor 51 ultimately reaches a level which is sufficient to turn on all of the other transistors. The voltage at that node then becomes a constant, regardless of an increasing magnitude of $V_{DD}$ above that level. The circuit generates low variance analog levels without the presence of switching circuits that could draw DC current of significant magnitude. Capacitors 60 and 61 are used to stabilize the analog voltages.

In this way, the voltage reference generator output $V_{REF}$ tracks the supply voltage $V_{DD}$ at low voltage levels during operation in the low voltage (non-programming) mode. And when $V_{DD}$ reaches the predetermined voltage level at which transistor 51 is turned on, which is less than the highest magnitude of $V_{DD}$, $V_{REF}$ is clamped at that voltage level. After the clamp voltage is set, the voltage applied to VMUX 38 for row control is slightly above the clamp voltage, and the voltage applied to the sense amplifier 17 for column control is slightly below the clamp voltage, by virtue of the different electrical connections of the row control and column control output paths to the transistor string of the circuit of FIG. 3. As $V_{DD}$ continues to rise to its full voltage, the voltages applied to the VMUX and the sense amplifier remain constant at thresholds respectively above and below the clamp voltage level.

The effect is that of quickly pre-charging a capacitor, then discharging it slightly to a lower level, and then reading the EPROM memory cell. The difference ΔV in voltage levels during this operation is relatively small, and consequently very little current is drawn in contrast to prior art slow speed designs in which a traditional DC reference draws DC current at all times. In the circuit of FIG. 2, an AC dynamic current is present, but the EPROM device operates at considerably higher speed, much higher current can be drawn, and the average current level is small. The sense amplifier for the column decoder performs tracking at very low current (e.g., 500 nanoamps).

The X-decoder of the EPROM array is fed by the regulated reference voltage source, and when the X-decoder is being read, the source clamps the voltage on the word to a relatively low value not exceeding the program threshold, and with virtually no current dissipation. The same reference voltage source is applied to the Y-decoder of the circuit to limit the column voltage. In this way, both row and column voltages are limited to assure operation at the appropriate point set by the device implementation. Everything in this portion of the circuit is pre-charged, and turned on, except for ground (i.e., the switched ground circuit is off), and all voltages are brought up to full scale.

The accessed cell may then be read at high speed by virtue of the ground side or ground plane of the memory array being connected to the cell via the switched ground circuit. The row is driven all the way to $V_{DD}$ in one clock period, is clamped at a predetermined lower voltage in the next period, and the memory cell is grounded through the switched ground circuit to enable a readout of the cell. The actual speed path for this architecture is only the time required to ground the source electrode combined with the time required to trip the sense amplifier.

The circuit design accommodates the need to read the EPROM memory element at very low threshold voltage without drawing substantial current in the sense amplifier. While the invention arose from design considerations flowing from a need to shrink a current product in contemplation of a scaling of the process technology, the invention is not limited to such considerations.

Although a presently contemplated best mode of practicing the invention has been described herein, it will be understood by those skilled in the art to which the invention pertains, from a consideration of the foregoing description, that variations and modifications of the preferred embodiment and method of the invention may be made without departing from the true spirit and scope of the invention. Accordingly, it is intended that the invention shall be limited only to the extent required by the appended claims and the rules and principles of the applicable case law.

What is claimed is:

1. A read-only memory having a memory array in which memory elements at respective intersections of row lines and column lines of the array are programmable at a programming threshold voltage level for subsequent readout of data contents of the memory elements, the read-only memory comprising:

X-decoder means for selectively accessing row lines of the array,

Y-decoder means for selectively accessing column lines of the array, and sense amplifier means associated with each column line, means for selectively energizing each of the X-decoder means and the Y-decoder means to access a selected memory element, a ground plane for the array, switch means for selectively establishing an electrical connection between the ground plane and the selected memory element to allow current flow through said memory element for detection and readout of the data content thereof by the sense amplifier means associated with the respective column line, and timing means for enabling said switch means to establish said electrical connection to the ground plane only after the row and column lines associated with the selected memory element have been pre-charged to and have stabilized at a predetermined voltage level not exceeding the programming threshold voltage level.

2. The read-only memory of claim 1, wherein said read-only memory is an electrically programmable read-only memory (EPROM).

3. The read-only memory of claim 1, including:

a supply voltage source for said memory having a voltage level exceeding said programming threshold voltage level, and means for pre-charging the row line and column line associated with the selected memory element of the array to a voltage up to the level of the supply voltage during a first clock period of said timing means, and for thereafter reducing the pre-charge voltage level and clamping thereof at a relatively low value below the programming threshold voltage level during a second clock period of the timing means, to limit current dissipation during readout of the data content of the selected memory element.

4. A method of reading data from a read-only memory having a memory array in which memory elements at respective intersections of rows and columns of the array are programmable for selective storage of data therein, in which an X-decoder selects rows as word lines and a Y-decoder selects columns as bit lines and sense amplifiers are respectively associated with columns of the memory array, to access selected memory elements for reading data stored therein, said method comprising the steps of:

accessing the address of a memory element selected for readout of the data content thereof, pre-charging the selected memory element to a predetermined voltage level for readout, and only after said predetermined voltage level has stabilized, initiating readout of the data content of the selected memory element by selectively connecting the selected memory element to a ground plane of the array to establish current flow therethrough for detection by the associated sense amplifier.

5. The method of claim 4, wherein said read-only memory is an erasable programmable read-only memory (EPROM).

6. A method of reading data at high speed from selected memory elements of an erasable programmable read-only memory (EPROM) having a memory array with memory elements at respective intersections of rows and columns of the array, said method comprising the steps of:

establishing a bias voltage on a row associated with a selected memory element of the EPROM array, establishing a bias voltage on a column associated with the selected memory element, and selectively establishing a current path through the selected memory element to enable readout of data content of the selected memory element only after said bias voltages in the memory element have stabilized and only for a period of time sufficient to perform said readout.

7. The read-only memory of claim 1, wherein said timing means activates the sense amplifier means during the time said connection to the ground plane is established and disables said switch means to disconnect the ground plane after a time interval sufficient for readout of the data content of the selected memory element.

8. The method of claim 4, including performing the step of pre-charging during two successive clock periods, by first applying a voltage level exceeding a programming threshold voltage level of the memory elements and up to a supply voltage level for the read-only memory to a word line associated with the selected memory element during a first clock period, and then reducing the applied voltage level to a value not exceeding said programming threshold voltage level and clamping the respective word line and column line associated with the selected memory element to the reduced voltage level during a second clock period of sufficient duration to allow the applied voltage level to stabilize.

9. The method of claim 8, including initiating said readout of the data content of the selected memory element during a third clock period immediately following the second clock period, and activating said associated sense amplifier for detection of current through the selected memory cell during the third clock period.

10. The method of claim 9, further including the step of disconnecting the selected memory element from the ground plane of the array to cut off current flow therethrough immediately upon expiration of the third clock period.

11. The method of claim 6, wherein the step of selectively establishing a current path is performed by connecting the selected memory element to a point of ground potential for the array only during said period of time following stabilization of said voltages.

12. The method of claim 11, further including activating a sense amplifier to detect current flow through the selected memory element during said period of time that the selected memory element is connected to a point of ground potential.

13. The method of claim 6, wherein the step of selectively establishing a current path is performed by connecting the memory array to a ground plane only during said period of time following stabilization of said voltages.

14. The method of claim 13, further including activating a sense amplifier for said column associated with the selected memory element to detect current flow through the selected memory element during said period of time that the memory array is connected to the ground plane.

* * * * *